United States Patent [19]
Talbot et al.

[11] Patent Number: 6,084,774
[45] Date of Patent: Jul. 4, 2000

[54] APPARATUS AND METHOD FOR MOUNTING A PROCESSOR CIRCUIT BOARD ON A SYSTEM MOTHER BOARD

[75] Inventors: Gerald Talbot, Concord; Michael Beale, Pepperell; Michael Reynolds, Norton, all of Mass.

[73] Assignee: Alpha Processor, Inc., Concord, Mass.

[21] Appl. No.: 09/335,145

[22] Filed: Jun. 17, 1999

[51] Int. Cl.[7] .................................................. H05K 7/20
[52] U.S. Cl. ......................... 361/704; 361/690; 361/695; 361/694; 361/715; 361/719; 361/707; 165/80.2; 165/80.3; 165/185; 174/16.1; 174/16.3
[58] Field of Search ..................................... 361/683, 684, 361/687, 690, 695, 704, 707, 709, 719, 741, 756; 257/721, 722, 727; 165/80.2, 80.3, 104.33, 185; 174/16.1, 16.3

[56] References Cited

U.S. PATENT DOCUMENTS

| | | | |
|---|---|---|---|
| 5,650,917 | 7/1997 | Hsu | 361/759 |
| 5,748,446 | 5/1998 | Feightner et al. | 361/709 |
| 5,894,408 | 4/1999 | Stark et al. | 361/704 |
| 5,936,836 | 8/1999 | Scholder | 361/695 |
| 5,947,192 | 9/1999 | Kuo | 165/80.3 |
| 5,966,289 | 10/1999 | Hastings et al. | 361/704 |

*Primary Examiner*—Leo P. Picard
*Assistant Examiner*—Boris L. Chervinsky
*Attorney, Agent, or Firm*—Samuels, Gauthier & Stevens LLP

[57] ABSTRACT

A structure and method for mounting a processor assembly on a mother board and a structure and method for cooling the processor assembly are described. The processor assembly includes a processor circuit board assembly which is located adjacent to a heat sink for removing heat from the circuit board assembly. The heat sink and circuit board assembly are maintained in an upright position with respect to the mother board by a frame mounted on the mother board and/or the computer system chassis. A cover mounted to the top of the frame holds a connector on the processor circuit board assembly in mating contact with a connector on the mother board. The cover also serves to complete an enclosure around the heat sink and processor circuit board assembly. Fans mounted to the frame move air from an intake end of the processor assembly, across cooling fins on the heat sink, to an outlet end of the processor assembly such that a ducted cooling system is provided for the processor assembly.

23 Claims, 8 Drawing Sheets

APPARATUS AND METHOD FOR MOUNTING A PROCESSOR CIRCUIT BOARD ON A SYSTEM MOTHER BOARD

BACKGROUND OF THE INVENTION

In some processing systems such as personal computer systems, microprocessor integrated circuits are mounted on processor circuit board assemblies. These assemblies can include processor supporting circuitry such as memories and discrete components mounted to and interconnected via a printed circuit board. In a typical processor system, the processor circuit board assembly is one of a plurality of circuit board assemblies connected to a system interconnection board or "mother board."

Mother boards and their host computer systems are typically required to meet specified standards for mechanical configuration such that system failures are reduced and component interchangeability is maintained. For example, some personal computer mother boards are manufactured to the ATX Specification industry standard for personal computers. As processors used in personal computers become more complex, so do their supporting circuitry and the circuit board assemblies on which they are mounted. It is important that the circuit board assemblies do not compromise the mechanical characteristics of the systems in which they are mounted as their electrical requirements mature.

Also, to accommodate the rapid progress being made in processors, it is also becoming desirable that the mechanical interface between mother boards and processor circuit board assemblies be made to facilitate removal and replacement of processor circuit board assemblies such that system upgrades can be readily performed in the field. Hence, the mechanical interface for the processor circuit board assembly and the mother board should not only provide mechanical rigidity to maintain structural integrity, but should also allow for removal of the circuit board assembly to facilitate system upgrades.

As computing systems become more complex, faster and more complex processors are being developed. These processors typically consume an increasing amount of power. This presents a problem in removing heat dissipated by the processors and associated devices, since processors can suffer degraded performance and failure at high temperature.

SUMMARY OF THE INVENTION

In one aspect, the present invention is directed to a processor assembly which can be mounted on another circuit board, such as the mother board of a personal computing system, which provides structural support for the processor circuit board assembly on which a processor is mounted while allowing the processor circuit board assembly to be removed readily from the mother board to accommodate system upgrades. The processor assembly of the invention includes the processor circuit board assembly on which the processor is mounted. In one embodiment, the processor circuit board assembly includes a connector at its bottom edge for connecting the processor circuit board assembly to the mother board. The processor circuit board assembly is positioned within a frame, which includes a mounting portion by which the frame can be mounted to the mother board. The frame also includes an upright slide portion for holding the processor circuit board assembly. The slide portion includes a pair of upright supports, each support including a channel for supporting the processor circuit board assembly such that the processor circuit board assembly can be held in an upright position with respect to the mother board by the pair of upright supports. When the processor circuit board assembly is held in the upright supports, the connector on the bottom edge of the processor circuit board assembly is positioned adjacent to a mating connector on the mother board. A cover can be mounted on the top portion of the frame adjacent to a top edge of the processor circuit board assembly to hold the processor circuit board assembly upright on the mother board with the connector on the processor circuit board assembly mated with the connector on the mother board.

In one embodiment, the processor assembly of the invention also includes a handle coupled to the processor circuit board assembly to facilitate removal of the processor circuit board assembly from the mother board. When the cover is removed, the handle can be used to manually pull the processor circuit board assembly off of the mother board.

In one embodiment, the mother board is compatible with the ATX Specification for a standard personal computer mother board. As such, in one embodiment, the mother board is part of a computing system which is mounted within a standard chassis. In one embodiment of the invention, in order to provide sufficient mechanical support for the processor assembly, the frame portion of the assembly is not mounted directly to the mother board. Instead, it is mounted through the mother board to the chassis of the system. This can be accomplished by using spacing fasteners positioned between the mother board and the chassis. The spacing fasteners can be fixed to the mounting portion of the frame such that the frame is mechanically mounted to the chassis. In one embodiment, each spacing fastener includes a threaded end which is threaded into threaded holes formed in the mounting portion of the frame. Each spacing fastener also preferably includes a spacing portion which supports the mother board between the frame and the chassis in stationary relation with respect to the chassis.

In another aspect, the invention is directed to a structure and method for providing cooling to the processor circuit board assembly. In accordance with this aspect of the invention, the processor assembly includes a heat sink located adjacent to the processor circuit board assembly for conducting heat away from the processor circuit board assembly. The frame includes an enclosing portion, for example, a side cover and a top cover, for at least partially enclosing the processor circuit board assembly and the heat sink. A fan is mounted on the frame to move air into the processor assembly at an air intake and of the processor assembly, across the heat sink to remove heat from the heat sink, and out of the processor assembly at an air outlet end of the assembly. This structure, namely, that including the fan, the heat sink and the enclosing portion of the frame, form a ducted cooling system for the processor assembly.

The heat sink includes a back side which is thermally coupled to the processor circuit board assembly and a front side which includes a plurality of fins. Heat is conducted from the processor circuit board assembly at the back side of the heat sink to the fins on the front side. The fan can then move air across the fins to remove heat from the processor assembly.

In one embodiment, the heat sink includes at least one raised boss positioned on the back side of the heat sink to contact a predetermined portion of the processor circuit board assembly, which can be a circuit mounted on the circuit board assembly. In one embodiment, the circuit is a microprocessor circuit. In another embodiment, the circuit is a memory circuit. The back side of the heat sink can generally include multiple raised boss regions for contacting multiple predetermined positions on the processor circuit board assembly. The position of each boss is selected such that it contacts a particular circuit on the assembly. For example, a plurality of bosses can be formed to contact a plurality of memory circuits on the processor circuit board assembly.

The processor assembly can also include a heat spreading member positioned between the processor circuit board assembly and the heat sink. The heat spreading member is thermally coupled to both the processor circuit board assembly and the back side of heat sink to conduct heat from the processor circuit board assembly to the heat sink. In particular, the heat spreading member can be coupled to a particular component, such as a microprocessor circuit, on the processor circuit board assembly to remove heat from that component. In one embodiment, the heat spreading member is made of a material having a greater thermal conductivity than the heat sink. For example, the heat spreading member can be made of copper and may also be plated with silver or other highly thermally conductive material. The heat spreading member can be placed within a recessed region formed in the back side of the heat sink and can maintain thermal contact between the processor circuit board assembly and the back side of the heat sink.

The microprocessor package mounted on the processor circuit board assembly can include one or more threaded heat conductive studs which can be used to mount the heat spreader to the microprocessor package. In one embodiment of the invention, the heat spreader is held onto the microprocessor package by nuts threaded onto the studs. Then, the processor circuit board assembly and heat spreader are mounted to the heat sink by screws passing through clearance areas formed in the fins on the front of the heat sink and threading into threaded holes formed near the edges of the heat spreader. The processor circuit board assembly and heat spreader are positioned in such a way that the nuts at the ends of the studs on the microprocessor package are aligned with corresponding recess regions formed in the back side of the heat sink. The recessed regions are formed at a depth sufficient to allow clearance for the nuts. Because the heat spreader, rather than the heat sink itself, is attached by the studs and nuts to the microprocessor package, it is not necessary to remove fin material from the front side of the heat sink to provide access to the nuts. Therefore, the assembly configuration of the heat spreader, heat sink and processor circuit board assembly eliminates the need to remove heat sink fin material where it is needed most, i.e., near the microprocessor package. This improves the thermal performance of the system.

In one embodiment of the invention, the processor circuit board assembly is mounted and held to the heat sink by one or more clips which slide over studs or pins in the back side of the heat sink. One or more of the clips may be formed with a paddle section designed to contact one or more circuits located on the processor circuit board assembly to remove heat from the circuits.

The mounting and cooling structure and methods of the invention provide a processor assembly which can be mounted in a rigid and structurally sound configuration to the mother board in a personal computing system. The structure is configured such that very efficient circuit cooling can be achieved. The improvements over prior approaches provide a system with improved structural stability and upgradability, as well as improved thermal performance.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
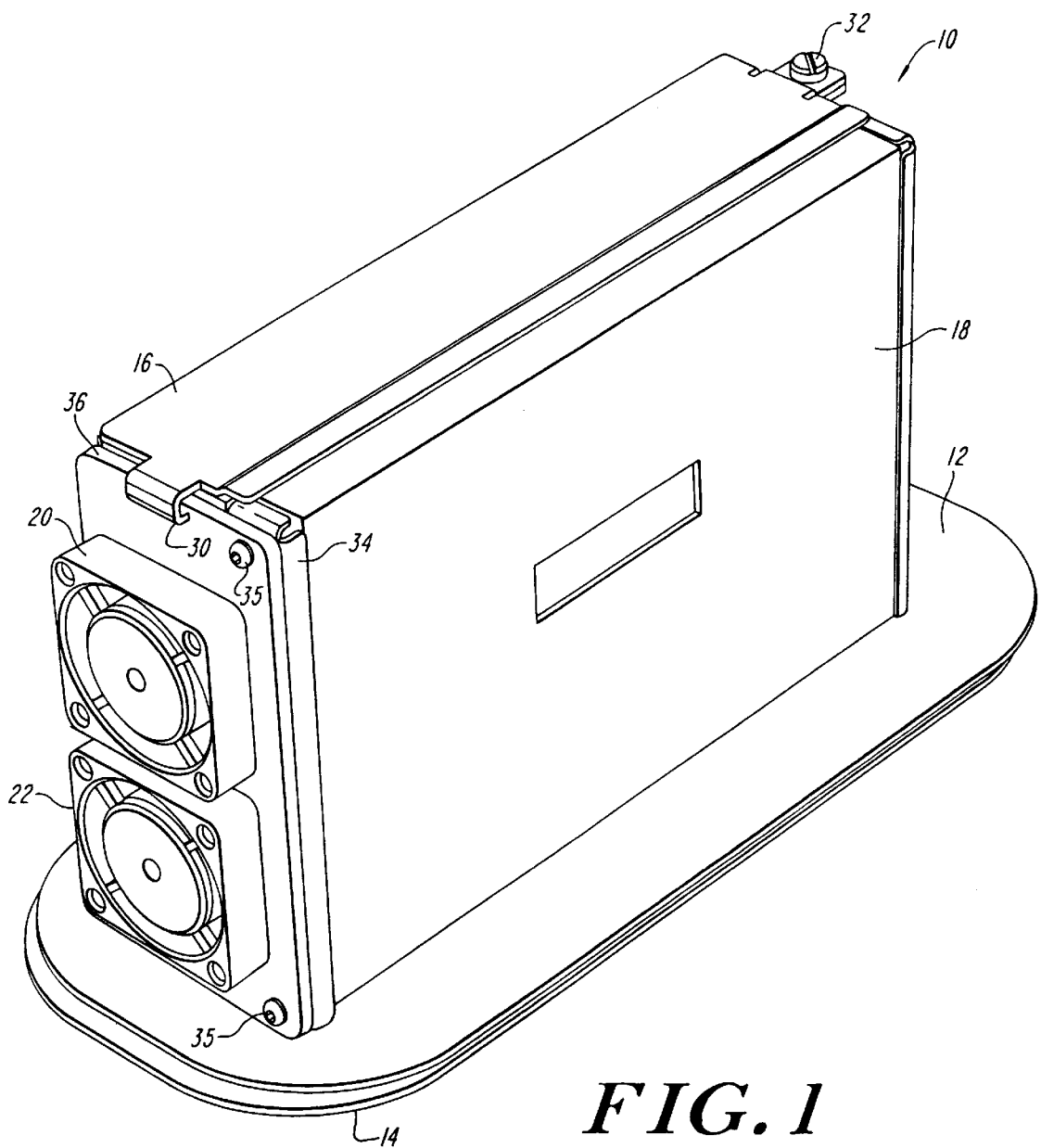
FIG. 1 is a schematic perspective view of a processor assembly mounted to a mother board and chassis in accordance with one embodiment of the present invention.

FIG. 1 is a schematic perspective view of one embodiment of a processor assembly 10 in accordance with the present invention mounted on a mother board 12 of a processing system. In one such system, in accordance with an ATX Specification standard, the mother board 12 is coupled to a system chassis 14 to provide mechanical stability.

In one embodiment, the assembly 10 includes a back cover 18 which partially encloses the assembly 10. A top cover 16 is held in place on top of the assembly 10 by a tab 30 and a screw 32. The assembly 10 is held in place by a frame 34 which is described and shown in more detail below. Cooling is supplied to the assembly 10 by a pair of electric fans 20 and 22 which are mounted to the assembly 10 at one end as shown. The fans are screwed into a spacer plate 36 which is in turn fastened to the frame 34 by screws 35.

Figure 2:
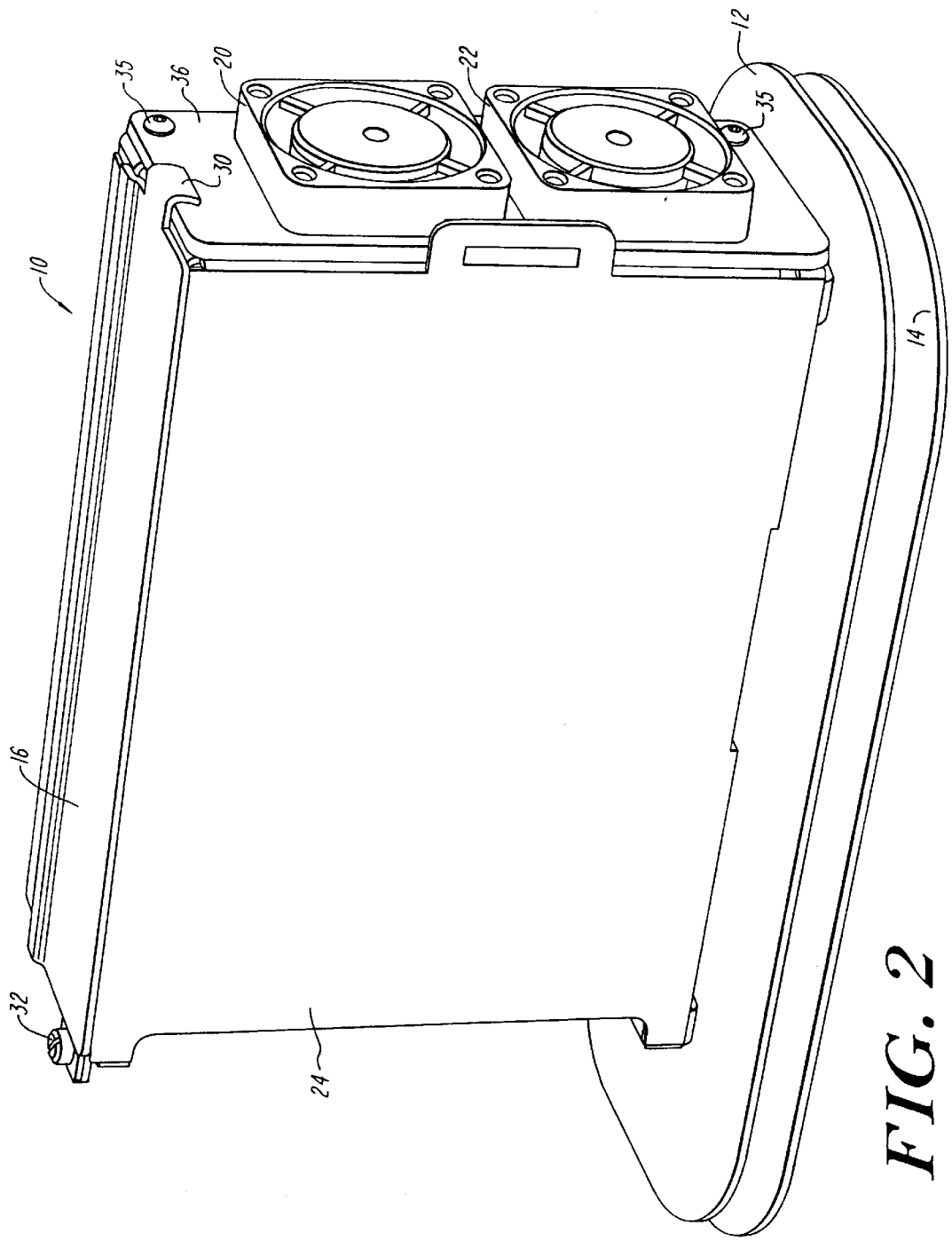
FIG. 2 is a another schematic perspective view of the processor assembly of FIG. 1 taken from a different view direction than that of FIG. 1.

FIG. 2 is a schematic perspective view of the processor assembly 10 mounted to the mother board 12 and the chassis 14 taken from a different view than the view of FIG. 1. As shown, the front side of the assembly 10 includes a front cover 24.

Figure 3:
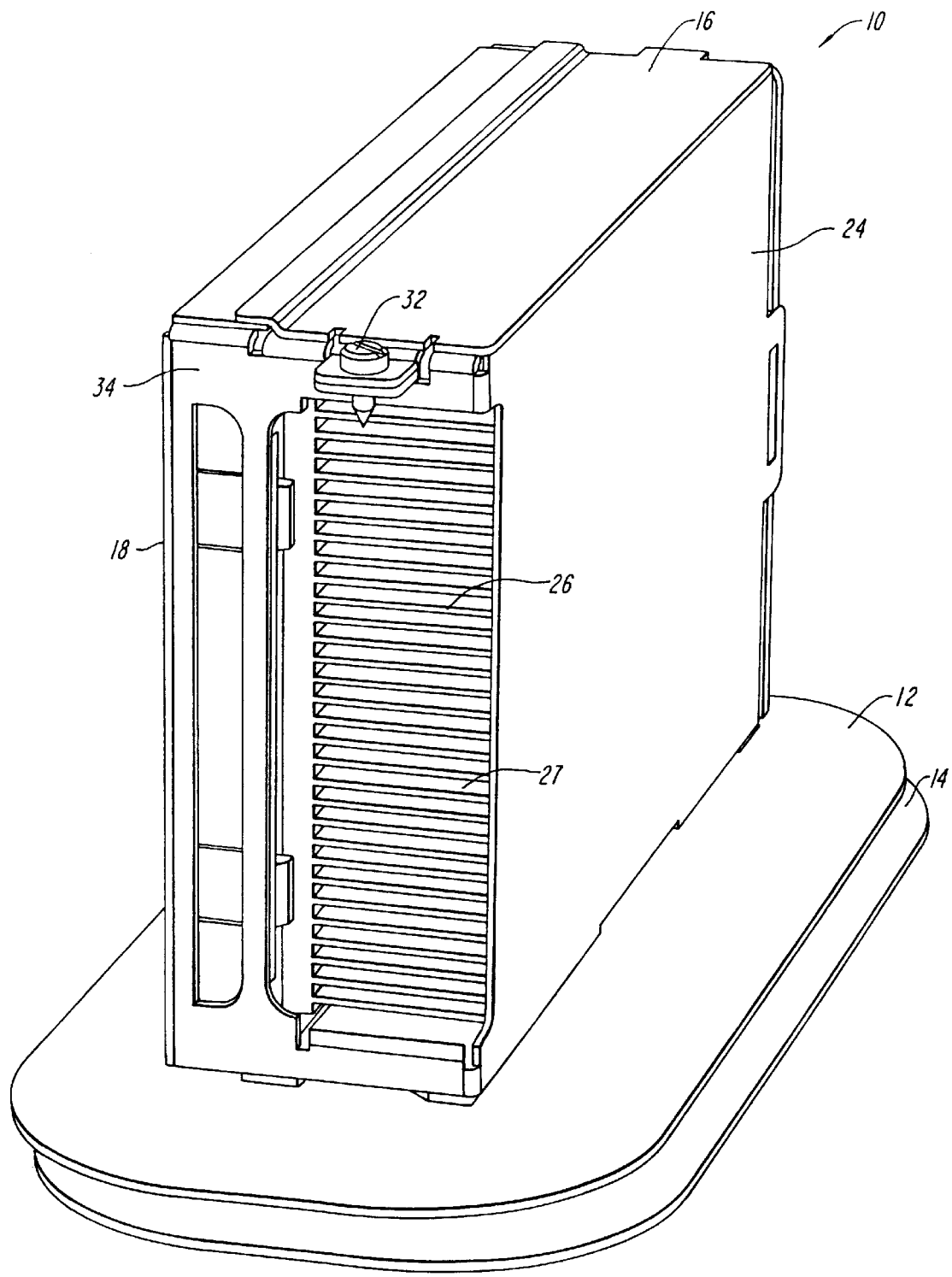
FIG. 3 is a third schematic perspective view of the processor assembly shown in FIGS. 1 and 2 taken at an end of the assembly.

FIG. 3 is a schematic perspective end view of the assembly 10 mounted to the mother board 12 and chassis 14. As shown in FIG. 3, the assembly 10 includes a heat sink 26. The fans 20 and 22, shown in FIGS. 1 and 2, move air across the fins 27 of the heat sink 26 as described below in detail to cool the assembly 10.

Figure 4:
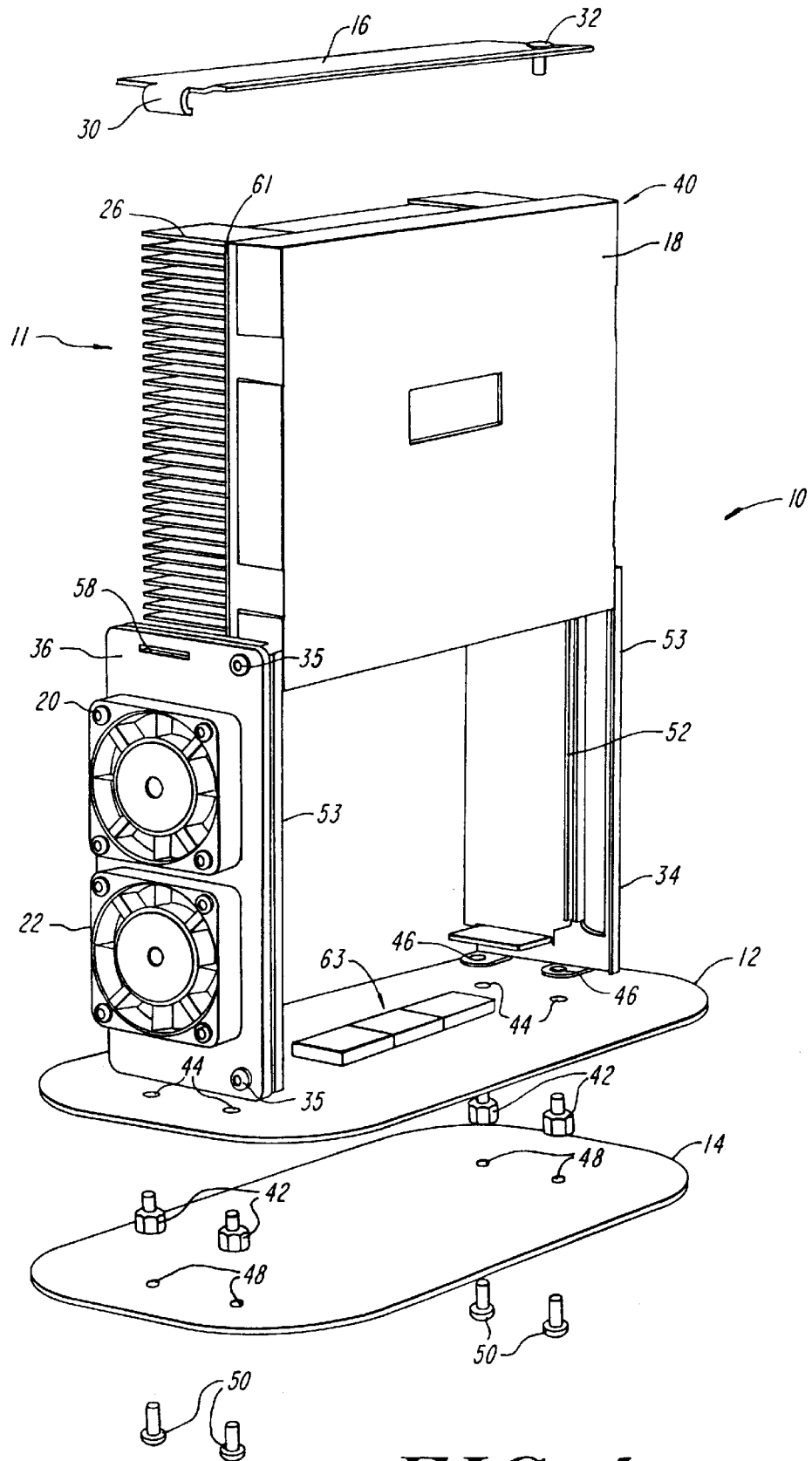
FIG. 4 is a schematic exploded view which illustrates mounting the assembly of FIGS. 1–3 on a mother board and supporting chassis in accordance with the present invention.

FIG. 4 is a schematic exploded view which shows how the assembly 10 is mounted to the mother board 12 and chassis 14. The frame 34 is mounted on the mother board 12 by four spacing fasteners 42. Each fastener 42 includes a male threaded end which passes through a clearance hole 44 formed in the mother board 12 and threads into threaded holes 46 formed in the mounting portion of the frame 34. The spacing fasteners 42 are secured to the chassis 14 by threaded screws 50. The screws 50 pass through clearance holes 48 formed in the chassis 14 and thread into female threaded holes in the bottom portions of the spacing fasteners 42. Hence, the processor assembly 10 is actually mechanically supported by the chassis 14, rather than by the less rigid mother board 12. This provides mechanical rigidity and structurally stability to the assembly.

As shown, the two fans 20 and 22 are mounted to the frame 34. The fans 20 and 22 move air across the assembly 11 when it is installed in the frame 34. The assembly 11, which includes the front cover 18, the back cover 24, the heat sink 26 and the processor circuit board assembly (described below), slides into position down onto the mother board 12 along slide channels or guides 52 formed in both of the parallel upright supports 53 of the frame 34. Each side of the assembly 11 has formed thereon a tab 61 which slides within its respective slide channel 52. The slide 61 can be formed as an integral part of the heat sink 26.

As shown, the mother board 12 also has mounted thereon one or more connectors 63 which mate with the processor circuit board assembly within the assembly 11 as described below in detail. When the assembly 11 is at the bottom of the uprights 53, a connector on the edge of the circuit board assembly mates with the connectors 63 on the mother board 12 to complete the interface between the processor circuit board assembly within the assembly 11 and the mother board 12.

The assembly 11 is held within the frame 34 by the top cover 16. When the assembly 11 is at the bottom of the uprights 53 of the frame 34, the tab 30 at the end of the top cover 16 mates with a slot 58 in the spacer plate 36. At the opposite end of the cover 16, a screw 32 threads into a threaded hole in the top of the frame 34 (not shown) to hold the cover 16 in place and hold the assembly 11 down onto the mother board such that the connector in the processor circuit board assembly (not shown) mates with the connector 63 on the mother board 12.

Figure 5:
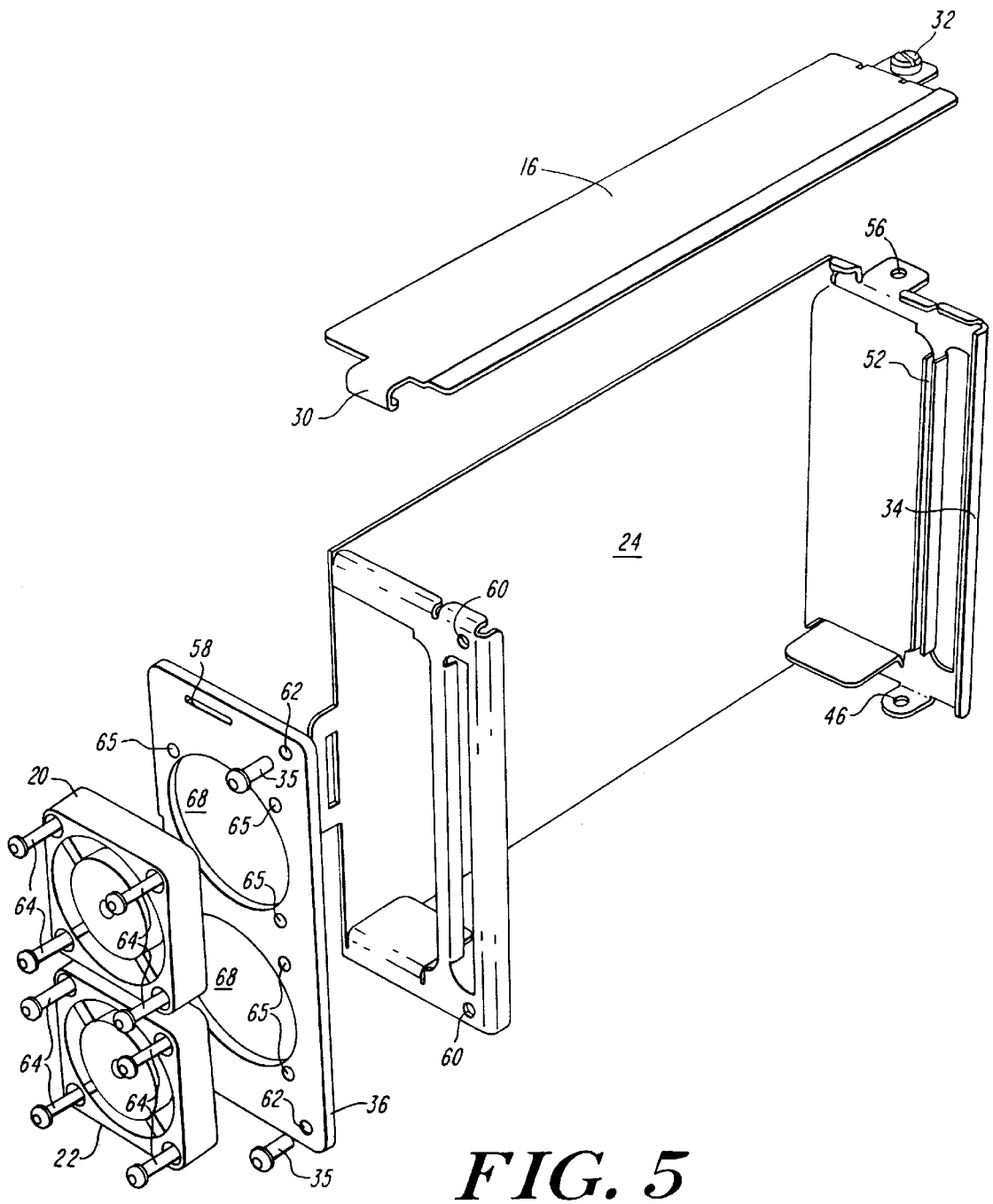
FIG. 5 is a schematic exploded view of a frame used in the processor assembly according to one embodiment of the present invention.

FIG. 5 is a schematic detailed exploded view which illustrates assembly of the frame 34, top cover 16 and fans 20 and 22. As shown, the fans 20 and 22 are bolted onto the spacer plate 36 by screws 64 which thread into threaded holes 62. The spacer plate 36 with the assembled fans 20, 22 is then bolted onto the frame 34 with threaded screws 35. The screws 35 pass through clearance holes 62 in the spacing plate 36 and thread into threaded holes 60 formed in the frame 34. The fans 20 and 22 are aligned with openings 68 formed in the spacing plate 36. The openings 68 formed a pair of ducts for the air flow driven by the fans 20 and 22 across the interior of the frame 34.

Figure 6:
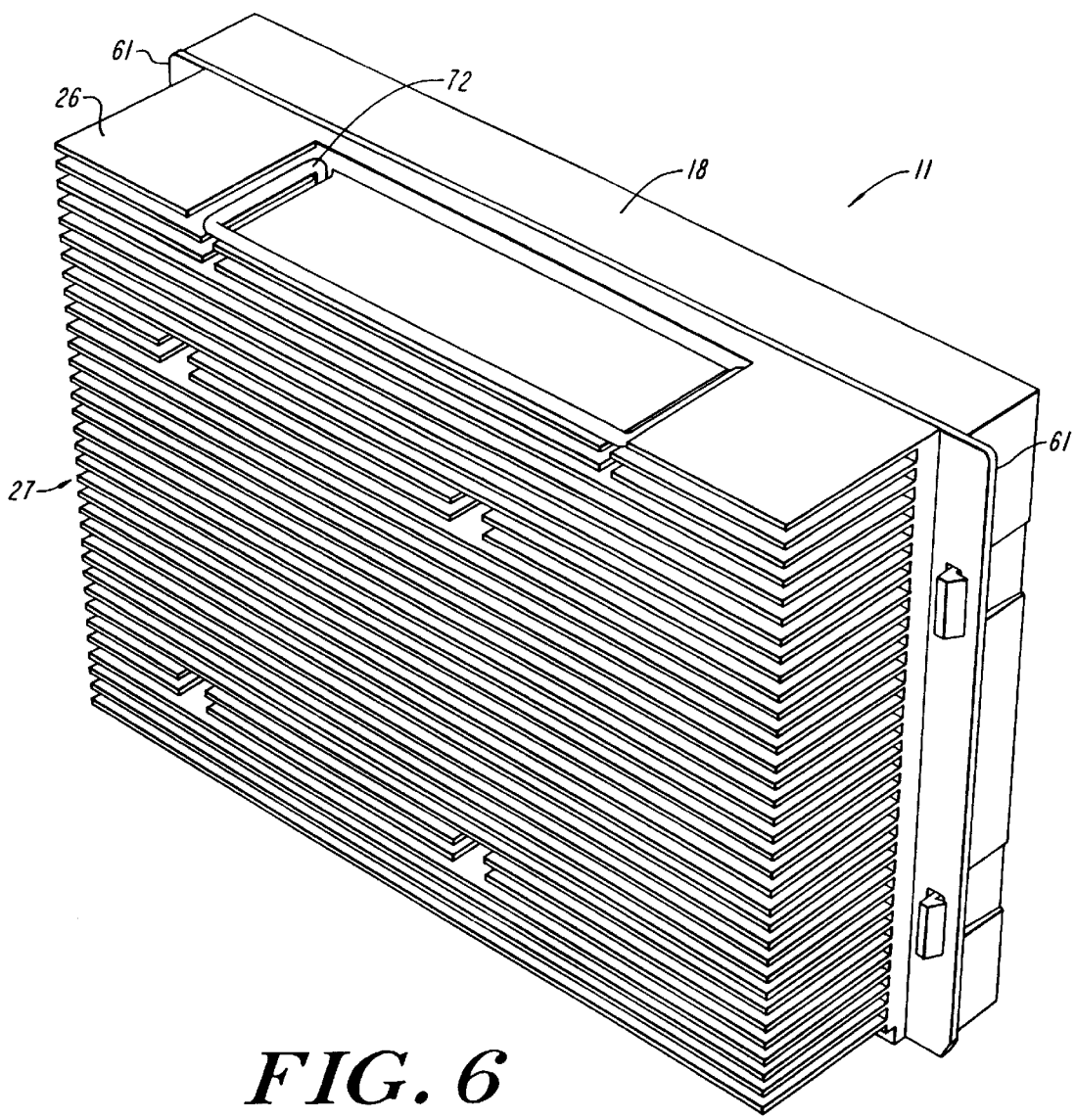
FIG. 6 is a schematic perspective view of a portion of the processor assembly of the present invention.

FIG. 6 is a schematic perspective view of one embodiment of the assembly 11 in accordance with the present invention. The assembly 11 includes the heat sink 26 which includes heat flow fins 27. A handle 72 is connected to the heat sink 26 to facilitate removal of the assembly 11 from the frame 34 and mother board 12. The assembly 11 also includes the back cover 18. The slide tabs 61, which slide within channels 52 of the uprights 53 of the frame 34, can be formed integrally with the heat sink 26, as shown.

Figure 7:
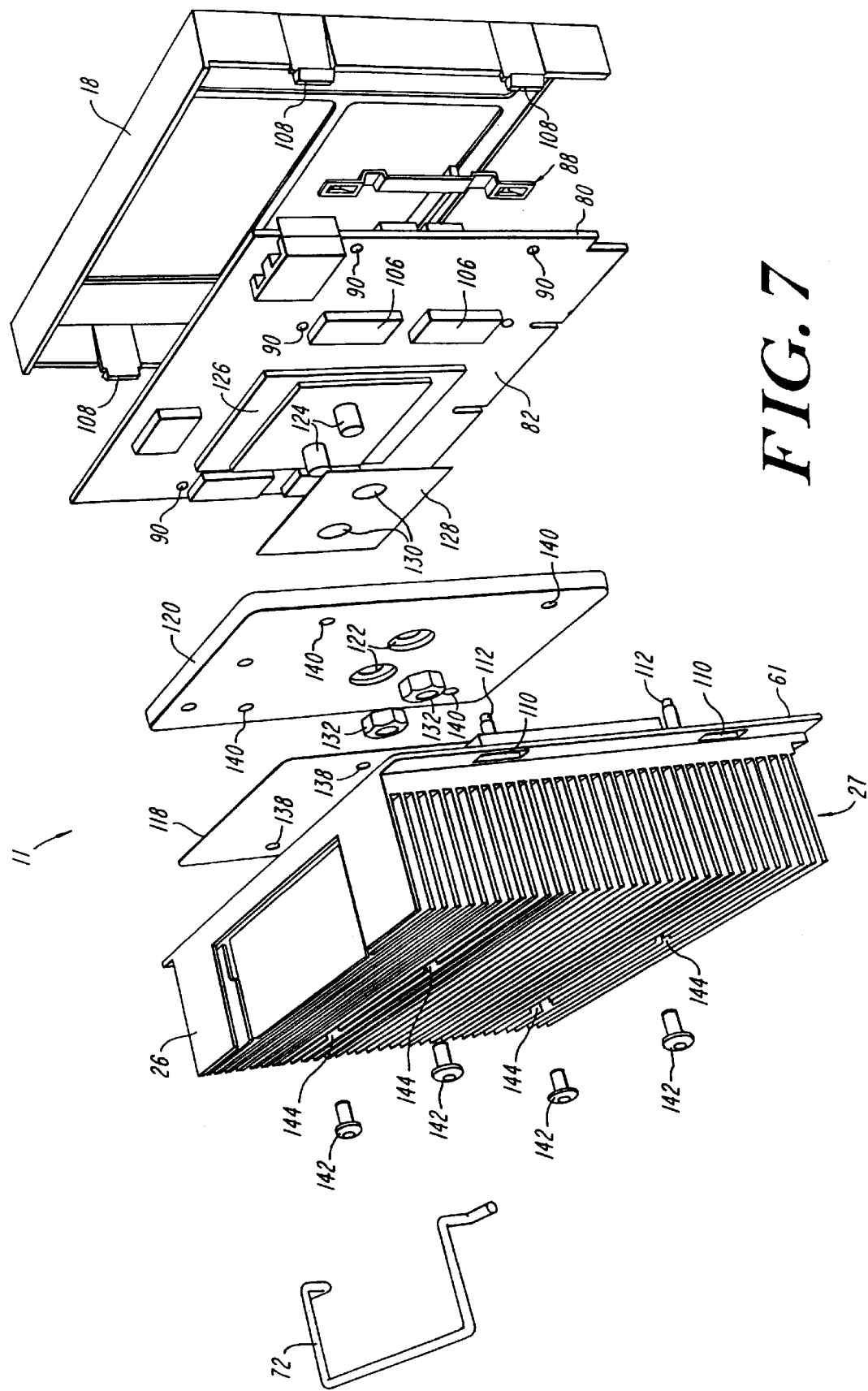
FIG. 7 is a schematic exploded view of the assembly of FIG. 6.
Figure 8:
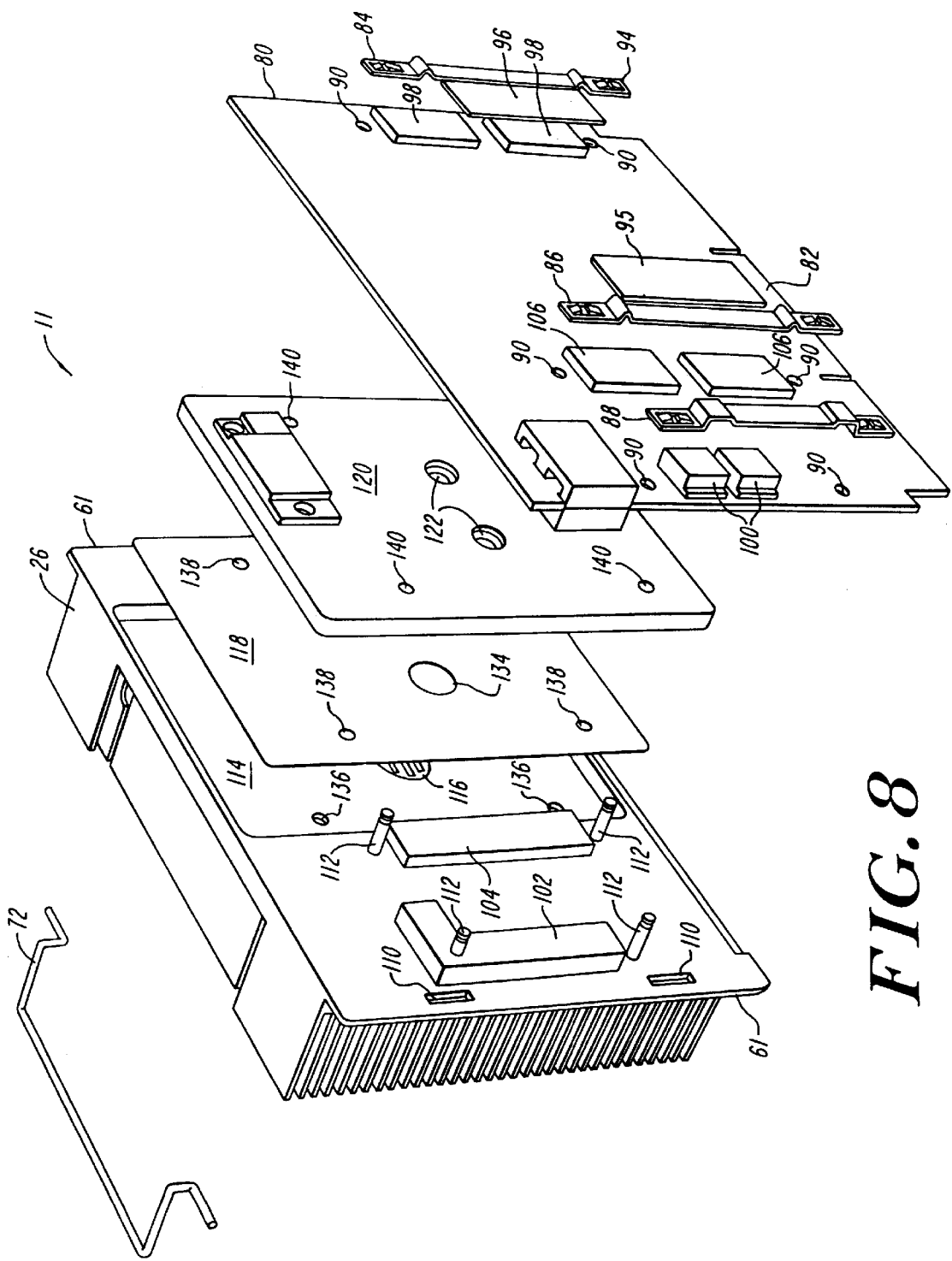
FIG. 8 is another schematic exploded view of the assembly of FIG. 6 taken from a different view direction than that of FIG. 6.

FIG. 7 is a schematic exploded view of the assembly 11 of FIG. 6. FIG. 8 is also a schematic exploded view of the assembly 11 of FIG. 6, taken from a different view angle than that of FIG. 7. Referring to FIGS. 7 and 8, the assembly 11 includes a printed circuit board assembly 80 which can include one or more integrated circuit components 106, 100, 98 and a processor circuit 126 mounted thereon. The processor circuit board assembly 80 also includes one or more connectors 82 which mate with the one or more connectors 63 on the mother board 12. The assembly 11 also includes the heat sink 26 for removing heat from the processor circuit board assembly 80.

In accordance with the invention, heat is conducted from one or more of the circuits mounted on the processor circuit board assembly 80 to the heat sink fins 27. The fans 20 and 22 mounted to the frame 34 then move air across the fins 27 to remove the heat from the assembly 11.

In accordance with the invention, the heat sink 26 is thermally coupled to particular predetermined portions of the processor circuit board assembly 80. To that end, the back side of the heat sink 26 can be formed with one or more raised boss areas 102, 104 which make contact with specific circuits or portions of the processor circuit board assembly 80. For example, raised boss 102 is positioned to contact the back side of components 100, which can be field-effect transistors (FETs) used with voltage regulators mounted on the processor circuit board assembly 80. The circuit board 80 can be manufactured with multiple metal-filled vias between the front and back sides of the board 80 to conduct heat from the FETs 100 to the boss 102. Also, the boss 104 can be formed to contact components 106 mounted on the board 80. These can be high-speed cache memories which dissipate high amounts of power and therefore produce significant heat. Other bosses (not shown) can be formed on the back side of the heat sink 26 to contact particular circuits on the processor circuit board assembly 80 as desired.

To conduct heat away from the microprocessor 126, the assembly 10 can include a heat spreader 120 interposed between the heat sink 26 and the processor circuit board assembly 80. The heat spreader 120 can be formed of a material having relatively high thermal conductivity, i.e., higher thermal conductivity than the material of which the heat sink 26 is made. For example, the heat sink 26 can be made of aluminum, and the heat spreader 120 can be made of a material such as copper and can be plated with a material such as silver. A soft flexible thermally conductive material 128, such as, for example, T-pli™ Low Thermal Resistance Interface Pad and Gap Filler material, manufactured by Thermagon, Inc., can be interposed between the microprocessor circuit package 126 and the heat spreader 120. The flexible material 128 is provided with clearance holes 130 to accept the heat conductive threaded studs 124 mounted to the microprocessor package 126. The heat spreader 120 is also provided with clearance holes 122 for the threaded studs 124. Nuts 132 are threaded onto the threaded studs 124 to hold the heat spreader 120 and the microprocessor package 126 together with the flexible thermally conductive material 128 captured therebetween.

The heat spreader 120 is mounted within a recessed region 114 formed in the back side of the heat sink 26. A second flexible thermally conductive material 118, such as, for example, T-gon, manufactured by Thermagon, Inc., can be interposed between the recessed region 114 of the heat sink 26 and the heat spreader 120. The heat spreader 120 is attached to the heat sink 26 by four threaded screws 142. The screws 142 pass through recessed regions 144 in the fins 27 of the heat sink 26, clearance holes 136 in the back side of the heat sink 26, clearance holes 138 in the flexible thermally conductive material 118 and thread into threaded holes 140 formed in the heat spreader 120.

Further contact between the back side of the heat sink 26 and the processor circuit board assembly 80 is maintained by a series of pins or studs 112 and clips 84, 86 and 88. The studs 112 pass through clearance holes 90 formed in the processor circuit board assembly 80. The clips 84, 86 and 88 engage grooved portions of the ends of the studs 112 to hold the processor circuit board assembly 80 in contact with the back side of the heat sink 26. The clips 84, 86 and 88 can hold specific circuits against corresponding bosses 102, 104 formed in the back side of heat sink 26. In one embodiment, the clips 84 and 86 can provide additional thermal conductivity to remove heat from the processor circuit board assembly 80. As shown, the clips 84 and 86 are formed of a thermally conductive material and include paddle portions 96 and 95, respectively. These paddle portions 96 and 95 can contact circuits formed on the back side of the processor circuit board assembly 80. Heat is conducted from the circuits, through the clip 84, 86, through the thermally conductive stud 112 to the heat sink 26, where the heat is removed. For example, the paddle portion 96 of clip 84 can be brought into contact with circuits 98 formed on the back side of the processor circuit board assembly 80 to remove heat from the circuits 98.

The processor circuit board assembly 80 is protected and enclosed by a back cover 18. Tabs 108 integrally formed on the cover 18 can be inserted into grooves 110 integrally formed on the back side of the heat sink 26 to hold the back cover 18 in place on the heat sink 26.

Referring again to FIGS. 1–4, it will be recognized that when the assembly 10 is installed on the mother board 12 and the top cover 16 is attached to the top of the frame 34, the processor assembly 10 is substantially enclosed with the exception of an air intake and an air outlet. The fans 20 and 22 control air flow from the intake to the outlet across the fins 27 of the heat sink 26 to cool the assembly. Hence, the frame enclosure and the fans providing air flow from an intake to an outlet provide a ducted cooling system for the assembly 10. The ducted nature of the cooling provides the ability to efficiently control the removal of heat from the assembly 10. This is in contrast to prior systems which can blow air onto a processor package without regard for a steady directional flow to more efficiently remove heat.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A processor assembly comprising:

a processor circuit board assembly on which the processor is mounted, the processor circuit board assembly including a connector at a bottom edge of the processor circuit board assembly connecting the processor circuit board assembly to a mother board;

a frame in which the processor circuit board assembly is positioned, the frame including a mounting portion by which the frame is mounted to the mother board and an upright slide portion holding the processor circuit board assembly, the upright slide portion including a pair of upright supports and each support including a channel, the processor circuit board assembly including a pair of tab portions engaging the channels in the upright supports to support the processor circuit board assembly such that the processor circuit board assembly is held in an upright position with respect to the mother board by the pair of upright supports; and a cover mounted on a top portion of the frame adjacent to a top edge of the processor circuit board assembly, the cover engaging the top edge of the processor circuit board assembly to hold the processor circuit board assembly upright on the mother board in the frame and to hold the connector at the bottom edge of the processor circuit board assembly mated with a mating connector on the mother board.

2. The processor assembly of claim 1 further comprising a handle coupled to the processor circuit board assembly, the handle facilitating removal of the processor circuit board assembly from the mother board.

3. The processor assembly of claim 1 wherein the mother board is a personal computer mother board.

4. The processor assembly of claim 3 wherein:

the mother board is part of a computer system mounted in a chassis; and the mounting portion of the frame is mounted to the chassis.

5. The processor assembly of claim 4 further comprising a spacing fastener between the mother board and the chassis, the mounting portion of the frame being fastened to the chassis by the spacing fastener.

6. The processor assembly of claim 5 wherein the spacing fastener comprises a spacing portion for supporting the mother board in stationary relation with respect to the chassis.

7. The processor assembly of claim 1 wherein:

the mother board is part of a computer system mounted in a chassis; and the mounting portion of the frame is mounted to the chassis.

8. The processor assembly of claim 7 further comprising a spacing fastener between the mother board and the chassis, the mounting portion of the frame being fastened to the chassis by the spacing fastener.

9. The processor assembly of claim 8 wherein the spacing fastener comprises a spacing portion for supporting the mother board in stationary relation with respect to the chassis.

10. The processor assembly of claim 1 further comprising a heat sink thermally coupled to the processor circuit board assembly for conducting heat away from the processor circuit board assembly.

11. The processor assembly of claim 10 wherein the heat sink is enclosed within the frame.

12. The processor assembly of claim 10 further comprising a fan mounted on the frame for moving air across the heat sink.

13. The processor assembly of claim 12 wherein the frame includes a cover portion adjacent to the heat sink such that the fan moves air into the processor assembly at an air intake end of the processor assembly, across the heat sink, and out of the processor assembly at an air outlet end of the processor assembly, such that the fan, the heat sink and the frame form a ducted cooling system for the processor assembly.

14. The processor assembly of claim 10 wherein the pair of tab portions on the processor circuit board assembly are formed on opposite sides of the heat sink.

15. A method of mounting a processor comprising:

mounting the processor on a processor circuit board assembly;

providing a connector at a bottom edge of the processor circuit board assembly for connecting the processor circuit board assembly to a mother board;

positioning the processor circuit board assembly within a frame, the frame including a mounting portion by which the frame is mounted to the mother board and an upright slide portion for holding the processor circuit board assembly, the slide portion including a pair of upright supports, each upright support including a channel supporting the processor circuit board assembly such that a pair of tab portions on the processor circuit board assembly engage the channels on the upright supports such that the processor circuit board assembly is held in an upright position with respect to the mother board by the pair of upright supports; and mounting a cover on a top portion of the frame adjacent to a top edge of the processor circuit board assembly, the cover engaging the top edge of the processor circuit board assembly to hold the processor circuit board assembly upright on the mother board in the frame and to hold the connector at the bottom edge of processor circuit board assembly mated with a mating connector on the mother board.

16. The method of claim 15 further comprising mounting the mounting portion of the frame to a chassis to which the mother board is mounted.

17. The method of claim 16 wherein mounting the mounting portion of the frame to a chassis comprises providing a spacing fastener between the mother board and the chassis, the mounting portion of the frame being fastened to the chassis by the spacing fastener.

18. The method of claim 15 further comprising mounting the frame to a chassis to which the mother board is mounted.

19. The method of claim 18 wherein mounting the mounting portion of the frame to a chassis comprises providing a spacing fastener between the mother board and the chassis, the mounting portion of the frame being fastened to the chassis by the spacing fastener.

20. The method of claim 15 further comprising thermally coupling the processor circuit board assembly to a heat sink to conduct heat away from the processor circuit board assembly.

21. The method of claim 20 further comprising enclosing wherein the heat sink is enclosed within the frame.

22. The method of claim 20 further comprising mounting a fan on the frame to move air across the heat sink.

23. The method of claim 22 further comprising covering the frame such that the fan moves air into the processor assembly at an intake end of the processor assembly, across the heat sink, and out of the processor assembly at an air outlet end of the processor assembly, such that the fan, the heat sink and the frame form a ducted cooling system for the processor assembly.

* * * * *